United States Patent
Estakhri et al.

(10) Patent No.: US 6,587,382 B1
(45) Date of Patent: *Jul. 1, 2003

(54) NONVOLATILE MEMORY USING FLEXIBLE ERASING METHODS AND METHOD AND SYSTEM FOR USING SAME

(75) Inventors: Petro Estakhri, Pleasanton, CA (US); Siamack Nemazie, San Jose, CA (US); Mahmud Assar, Morgan Hill, CA (US); Parviz Keshtbod, Los Altos, CA (US)

(73) Assignee: Lexar Media, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/175,928

(22) Filed: Jun. 19, 2002

Related U.S. Application Data

(63) Continuation of application No. 09/565,517, filed on May 5, 2000, now Pat. No. 6,411,546, which is a continuation-in-part of application No. 09/520,904, filed on Mar. 7, 2000, now Pat. No. 6,151,247, which is a continuation of application No. 09/330,278, filed on Jun. 11, 1999, now Pat. No. 6,122,195, which is a continuation-in-part of application No. 09/283,728, filed on Apr. 1, 1999, now Pat. No. 6,034,897, and a continuation-in-part of application No. 09/264,340, filed on Mar. 8, 1999, now Pat. No. 6,145,051, which is a continuation of application No. 08/831,266, filed on Mar. 31, 1997, now Pat. No. 5,907,856.

(51) Int. Cl.$^7$ .................................................. G11C 16/04
(52) U.S. Cl. ............................. 365/185.29; 365/185.11; 365/218; 365/230.03
(58) Field of Search ......................... 365/185.29, 185.11, 365/218, 230.03

(56) References Cited

U.S. PATENT DOCUMENTS

| | | | |
|---|---|---|---|
| 3,633,175 A | 1/1972 | Harper .................... 340/172.5 |
| 4,006,457 A | 2/1977 | Hepworth et al. ...... 340/147 R |
| 4,013,902 A | 3/1977 | Payne ......................... 307/268 |
| 4,210,959 A | 7/1980 | Wozniak .................... 364/200 |
| 4,250,570 A | 2/1981 | Tsang et al. ................ 365/200 |
| 4,279,024 A | 7/1981 | Schrenk ..................... 365/203 |
| 4,281,398 A | 7/1981 | McKenny et al. .......... 365/200 |
| 4,295,205 A | 10/1981 | Kunstadt .................... 364/900 |
| 4,309,627 A | 1/1982 | Tabata ........................ 307/362 |
| 4,354,253 A | 10/1982 | Naden ........................... 365/15 |
| 4,355,376 A | 10/1982 | Gould .......................... 365/200 |
| 4,380,066 A | 4/1983 | Spencer et al. ............... 371/10 |
| 4,392,208 A | 7/1983 | Burrows et al. ............ 364/900 |
| 4,405,952 A | 9/1983 | Slakmon ...................... 360/49 |
| 4,422,161 A | 12/1983 | Kressel et al. .............. 365/200 |

(List continued on next page.)

FOREIGN PATENT DOCUMENTS

| AU | 0 557 723 | 1/1987 | ............ G11C/5/00 |
|---|---|---|---|
| EP | 0 544 252 A2 | 6/1963 | ........... G11C/16/06 |

(List continued on next page.)

Primary Examiner—Son T. Dinh
(74) Attorney, Agent, or Firm—Law Offices of Imam

(57) ABSTRACT

An embodiment of the present invention is disclosed to include a nonvolatile memory system for controlling erase operations performed on a nonvolatile memory array comprised of rows and columns, the nonvolatile memory array stores digital information organized into blocks with each block having one or more sectors of information and each sector having a user data field and an extension field and each sector stored within a row of the memory array. A controller circuit is coupled to a host circuit and is operative to perform erase operations on the nonvolatile memory array, the controller circuit erases an identified sector of information having a particular user data field and a particular extension field wherein the particular user field and the particular extension field are caused to be erased separately.

1 Claim, 13 Drawing Sheets

Fig. 4b LUT

U.S. PATENT DOCUMENTS

| Patent | Date | Inventor | Class |
|---|---|---|---|
| 4,450,559 A | 5/1984 | Bond et al. | 371/10 |
| 4,456,971 A | 6/1984 | Fukuda et al. | 364/900 |
| 4,462,086 A | 7/1984 | Kurakake | 364/900 |
| 4,463,450 A | 7/1984 | Haeusele | 365/200 |
| 4,479,214 A | 10/1984 | Ryan | 371/11 |
| 4,493,075 A | 1/1985 | Anderson et al. | 371/10 |
| 4,498,146 A | 2/1985 | Martinez | 364/900 |
| 4,514,830 A | 4/1985 | Hagiwara et al. | 365/200 |
| 4,525,839 A | 6/1985 | Nozawa et al. | 371/38 |
| 4,527,251 A | 7/1985 | Nibby, Jr. et al. | 364/900 |
| 4,586,163 A | 4/1986 | Koike | 365/104 |
| 4,601,031 A | 7/1986 | Walker et al. | 371/10 |
| 4,612,640 A | 9/1986 | Mehrotra et al. | 371/51 |
| 4,616,311 A | 10/1986 | Sato | 364/200 |
| 4,617,624 A | 10/1986 | Goodman | 364/200 |
| 4,617,651 A | 10/1986 | Ip et al. | 365/200 |
| 4,642,759 A | 2/1987 | Foster | 364/200 |
| 4,654,847 A | 3/1987 | Dutton | 371/10 |
| 4,672,240 A | 6/1987 | Smith et al. | 307/449 |
| 4,688,219 A | 8/1987 | Takemae | 371/10 |
| 4,710,871 A | 12/1987 | Belknap et al. | 364/200 |
| 4,718,041 A | 1/1988 | Baglee et al. | 364/185 |
| 4,727,475 A | 2/1988 | Kiremidjian | 395/325 |
| 4,733,394 A | 3/1988 | Giebel | 371/21 |
| 4,740,882 A | 4/1988 | Miller | 364/132 |
| 4,746,998 A | 5/1988 | Robinson et al. | 360/72.1 |
| 4,748,320 A | 5/1988 | Yorimoto et al. | 235/492 |
| 4,757,474 A | 7/1988 | Fukushi et al. | 365/189 |
| 4,774,700 A | 9/1988 | Satoh et al. | 369/54 |
| 4,785,425 A | 11/1988 | Lavelle | 365/52 |
| 4,794,568 A | 12/1988 | Lim et al. | 365/200 |
| 4,796,233 A | 1/1989 | Awaya et al. | 365/200 |
| 4,800,520 A | 1/1989 | Iijima | 364/900 |
| 4,814,903 A | 3/1989 | Kulakowski et al. | 360/48 |
| 4,849,927 A | 7/1989 | Vos | 364/900 |
| 4,887,234 A | 12/1989 | Iijima | 364/900 |
| 4,896,262 A | 1/1990 | Wayama et al. | 364/200 |
| 4,914,529 A | 4/1990 | Bonke | 360/48 |
| 4,920,518 A | 4/1990 | Nakamura et al. | 365/228 |
| 4,924,331 A | 5/1990 | Robinson et al. | 360/72.1 |
| 4,942,556 A | 7/1990 | Sasaki et al. | 365/200 |
| 4,943,962 A | 7/1990 | Imamiya et al. | 365/230.02 |
| 4,945,535 A | 7/1990 | Hosotani et al. | 371/11.1 |
| 4,949,240 A | 8/1990 | Iijima | 364/200 |
| 4,949,309 A | 8/1990 | Rao | 365/218 |
| 4,953,122 A | 8/1990 | Williams | 364/900 |
| 4,958,323 A | 9/1990 | Sugawara et al. | 365/189.01 |
| 5,003,591 A | 3/1991 | Kauffman et al. | 380/10 |
| 5,034,926 A | 7/1991 | Taura et al. | 365/218 |
| 5,043,940 A | 8/1991 | Harari | 365/168 |
| 5,053,990 A | 10/1991 | Kreifels et al. | 364/900 |
| 5,058,074 A | 10/1991 | Sakamoto | 365/228 |
| 5,070,474 A | 12/1991 | Tuma et al. | 395/500 |
| 5,095,344 A | 3/1992 | Harai | 357/23.5 |
| 5,134,589 A | 7/1992 | Hamano | 365/238.5 |
| 5,138,580 A | 8/1992 | Farrugia | 365/218 |
| 5,155,705 A | 10/1992 | Goto et al. | 365/218 |
| 5,163,021 A | 11/1992 | Mehrotra et al. | 365/185 |
| 5,168,465 A | 12/1992 | Harari | 257/320 |
| 5,172,338 A | 12/1992 | Mehrotra et al. | 365/185 |
| 5,198,380 A | 3/1993 | Harari | 437/43 |
| 5,200,959 A | 4/1993 | Gross et al. | 371/21.6 |
| 5,226,168 A | 7/1993 | Kobayashi et al. | 395/800 |
| 5,268,318 A | 12/1993 | Harari | 437/43 |
| 5,268,870 A | 12/1993 | Harari | 365/218 |
| 5,268,928 A | 12/1993 | Herh et al. | 375/8 |
| 5,270,979 A | 12/1993 | Harari et al. | 365/218 |
| 5,280,198 A | 1/1994 | Almulla | 307/296.6 |
| 5,283,762 A | 2/1994 | Fujishima | 365/189.09 |
| 5,283,882 A | 2/1994 | Smith et al. | 395/425 |
| 5,293,560 A | 3/1994 | Harari | 365/185 |
| 5,297,148 A | 3/1994 | Harari et al. | 371/10.2 |
| 5,303,198 A | 4/1994 | Adachi et al. | 365/218 |
| 5,315,541 A | 5/1994 | Harari et al. | 365/63 |
| 5,329,491 A | 7/1994 | Brown et al. | 365/226 |
| 5,337,275 A | 8/1994 | Garner | 365/189.01 |
| 5,341,330 A | 8/1994 | Wells et al. | 365/185 |
| 5,341,339 A | 8/1994 | Wells | 365/218 |
| 5,343,086 A | 8/1994 | Fung et al. | 307/296.1 |
| 5,353,256 A | 10/1994 | Fandrich et al. | 365/230.03 |
| 5,357,475 A | 10/1994 | Hasbun et al. | 365/218 |
| 5,363,335 A | 11/1994 | Jungroth et al. | 365/226 |
| 5,369,615 A | 11/1994 | Harari et al. | 365/218 |
| 5,388,083 A | 2/1995 | Assar et al. | 365/218 |
| 5,396,468 A | 3/1995 | Harari et al. | 365/218 |
| 5,418,752 A | 5/1995 | Harari et al. | 365/218 |
| 5,422,842 A | 6/1995 | Cernea et al. | 365/185 |
| 5,428,569 A | 6/1995 | Kato et al. | 365/185 |
| 5,428,621 A | 6/1995 | Mehrotra et al. | 371/21.4 |
| 5,430,682 A | 7/1995 | Ishikawa et al. | 365/226 |
| 5,430,859 A | 7/1995 | Norman et al. | 395/425 |
| 5,434,825 A | 7/1995 | Harari | 365/185 |
| 5,438,573 A | 8/1995 | Mangan et al. | 371/10.3 |
| 5,446,408 A | 8/1995 | Tedrow et al. | 327/530 |
| 5,471,478 A | 11/1995 | Mangan et al. | 371/10.3 |
| 5,479,633 A | 12/1995 | Wells et al. | 395/430 |
| 5,479,638 A | 12/1995 | Assar et al. | 395/430 |
| 5,485,595 A | 1/1996 | Assar et al. | 395/430 |
| 5,495,442 A | 2/1996 | Cernea et al. | 365/185.03 |
| 5,495,453 A | 2/1996 | Wociechowski et al. | 365/185.18 |
| 5,502,682 A | 3/1996 | Yoshimura | 365/226 |
| 5,504,760 A | 4/1996 | Harari et al. | 371/40.1 |
| 5,508,971 A | 4/1996 | Cernea et al. | 365/185.23 |
| 5,524,230 A | 6/1996 | Sakaue et al. | 395/430 |
| 5,532,962 A | 7/1996 | Auclair et al. | 365/201 |
| 5,532,964 A | 7/1996 | Cernea et al. | 365/189.09 |
| 5,534,456 A | 7/1996 | Yuan et al. | 437/43 |
| 5,535,328 A | 7/1996 | Harari et al. | 395/182.05 |
| 5,544,118 A | 8/1996 | Harari | 365/218 |
| 5,544,356 A | 8/1996 | Robinson et al. | 395/600 |
| 5,554,553 A | 9/1996 | Harari | 437/43 |
| 5,563,825 A | 10/1996 | Cernea et al. | 365/185.18 |
| 5,566,314 A | 10/1996 | DeMarco et al. | 395/430 |
| 5,568,439 A | 10/1996 | Harari | 365/218 |
| 5,581,723 A | 12/1996 | Hasbun et al. | 395/430 |
| 5,583,812 A | 12/1996 | Harari | 365/185.33 |
| 5,586,285 A | 12/1996 | Hasbun et al. | 395/430 |
| 5,592,415 A | 1/1997 | Kato et al. | 365/185.01 |
| 5,592,420 A | 1/1997 | Cernea et al. | 365/185.18 |
| 5,603,001 A | 2/1997 | Sukegawa et al. | 395/430 |
| 5,642,312 A | 6/1997 | Harari | 365/185.33 |
| 5,663,901 A | 9/1997 | Wallace et al. | 365/52 |
| 5,693,570 A | 12/1997 | Cernea et al. | 437/205 |
| 5,712,819 A | 1/1998 | Harari | 365/185.29 |
| 5,719,808 A | 2/1998 | Harari et al. | 365/185.33 |
| 5,778,418 A | 7/1998 | Auclair et al. | 711/101 |
| 5,809,558 A | 9/1998 | Matthews et al. | 711/173 |
| 5,822,245 A | 10/1998 | Gupta et al. | 365/185.12 |
| 5,835,935 A | 11/1998 | Estakhri et al. | 711/103 |
| 5,845,313 A | 12/1998 | Estakhri et al. | 711/103 |
| 5,890,192 A | 3/1999 | Lee et al. | 711/103 |
| 6,081,447 A | 6/2000 | Lofgren et al. | 365/185.02 |

FOREIGN PATENT DOCUMENTS

| | | | | |
|---|---|---|---|---|
| EP | 0 220 718 A2 | 5/1987 | | G06F/15/40 |
| EP | 0 243 503 A1 | 11/1987 | | G11B/20/10 |
| EP | 0 424 191 A2 | 4/1991 | | G06F/11/00 |
| EP | 0 489 204 A1 | 6/1992 | | G11C/16/06 |
| EP | 0 522 780 A2 | 1/1993 | | G06F/3/06 |
| EP | 0 686 976 A2 | 12/1995 | | G11C/16/06 |

| | | | | | | | | |
|---|---|---|---|---|---|---|---|---|
| FR | 93 01908 | 8/1993 | ........... G06F/12/02 | | JP | 61-96598 A | 5/1986 | ........... G11C/17/00 |
| JP | 59-45695 A | 9/1982 | ........... G11C/17/00 | | JP | 59-218813 | 5/1986 | ........... G11C/17/00 |
| JP | 830183425 | 9/1983 | ........... G11C/17/00 | | JP | 870210607 | 8/1987 | ........... G06F/11/00 |
| JP | 57-98307 | 12/1983 | ........... G11C/17/00 | | JP | 61-124731 | 12/1987 | ........... G11C/17/00 |
| JP | 57-98308 | 12/1983 | ........... G11C/17/00 | | JP | 61-124732 | 12/1987 | ........... G11C/17/00 |
| JP | 58-215794 A | 12/1983 | ........... G11C/17/00 | | JP | 62-283496 A | 12/1987 | ........... G11C/17/00 |
| JP | 58-215795 A | 12/1983 | ........... G11C/17/00 | | JP | 62-283497 A | 12/1987 | ........... G11C/17/00 |
| JP | 58-36964 | 3/1984 | ........... G11C/17/00 | | JP | 62-15703 | 7/1988 | ........... G11C/17/00 |
| JP | 57-157217 | 3/1984 | ........... G11C/17/00 | | JP | 63-183700 A | 7/1988 | ........... G11C/17/00 |
| JP | 59-70414 | 4/1984 | ........... G11C/29/00 | | JP | 1054543 | 3/1989 | ........... G06F/11/00 |
| JP | 59-162695 A | 9/1984 | ........... G11C/17/00 | | JP | 3-101107 | 11/1992 | ........... G11C/29/00 |
| JP | 60076097 | 4/1985 | ........... G11C/17/00 | | JP | 4-332999 A | 11/1992 | ........... G11C/29/00 |
| JP | 60-178564 | 9/1985 | ........... G06F/13/16 | | JP | 6-250798 | 9/1994 | ........... G06F/3/08 |
| JP | 60-212900 | 10/1985 | ........... G11C/29/00 | | WO | 84/00628 | 2/1984 | ........... G06F/11/20 |

Fig. 4b LUT

NONVOLATILE MEMORY USING FLEXIBLE ERASING METHODS AND METHOD AND SYSTEM FOR USING SAME

REFERENCED TO PRIOR APPLICATION

This application is a continuation of a previously filed co-pending U.S. application, Ser. No. 09/565,517, filed on May 5, 2000, now U.S. Pat. No. 6,411,546 and entitled "NONVOLATILE MEMORY USING FLEXIBLE ERASING METHODS AND METHOD AND SYSTEM FOR USING SAME", which is a continuation-in-part application of a previously filed and co-owned and co-pending U.S. patent application, Ser. No. 09/520,904 entitled "METHOD AND APPARATUS FOR DECREASING BLOCK WRITE OPERATION TIMES PERFORMED ON NONVOLATILE MEMORY, filed on Mar. 7, 2000, now U.S. Pat. No. 6,151,247 which is a continuation application of U.S. patent application Ser. No. 09/330,278, entitled "METHOD AND APPARATUS FOR DECREASING BLOCK WRITE OPERATION TIMES PERFORMED ON NONVOLATILE MEMORY", filed on Jun. 11 , 1999, now U.S. Pat. No. 6,122,195 which is a continuation-in-part of a previously-filed application, entitled "SPACE MANAGEMENT FOR MANAGING HIGH CAPACITY NONVOLATILE MEMORY", application Ser. No. 09/283,728, filed on Apr. 1, 1999, now U.S. Pat. No. 6,034,897 and another previously-filed application, entitled "MOVING SECTORS WITHIN A BLOCK OF INFORMATION IN A FLASH MEMORY MASS STORAGE ARCHITECTURE", application Ser. No. 09/264,340, filed on Mar. 8, 1999, now U.S. Pat. No. 6,145,051 which is continuation of Ser. No. 08/831,266, filed Mar. 31, 1997, is now U.S. Pat. No. 5,907,856, entitled "MOVING SECTORS WITHIN A BLOCK OF INFORMATION IN A FLASH MEMORY MASS STORAGE ARCHITECTURE". The disclosure of all these patent documents are incorporated herein by reference as though set forth in full.

FIELD OF THE INVENTION

The present invention generally relates to controlling the erase operation of nonvolatile memory devices, and, in particular, to control circuits for causing flexible erasing of various parts of the memory devices.

BACKGROUND OF THE INVENTION

Nonvolatile memory devices, which include nonvolatile memory arrays, have various applications for storing digital information. One such application is for storage of large amounts of digital information for use by digital cameras, as replacements for hard disk within personal computer (PCs) and so forth. Nonvolatile memory arrays are comprised of various types of memory cells, such as EEPROMs, flash.and other types of structures known to those of ordinary skill in the art that have the characteristic of maintaining information stored therein while power is disconnected or disrupted.

In applications enumerated hereinabove and others known in the industry, nonvolatile memory is organized into blocks with each block being identified by a virtual physical block address (VPBA). Each block is generally comprised of a number of sectors (or pages). For example, a block typically includes 16 or 32 sectors. Each sector typically includes various fields such as a user data field and an extension field. The user data field is used to store the user information sought to be saved and the extension field includes field used to store other types of information. The extension field includes an error correction code (ECC) field for storing ECC information, an address field for storing address information and a flag field for storing flag information. In prior art systems, the address field stored within the extension field is a virtual logical block address (VLBA) for identifying the virtual logical block address of the block being written, read or erased. The user data fields and extension fields are included within a sector of information.

Nonvolatile memory units include one or more nonvolatile memory devices or arrays for operation under the direction of a controller circuit that is coupled to a host circuit for receiving certain commands therefrom. For example, the host can read from and/or write digital information to the nonvolatile memory unit through the controller circuit. The controller circuit, in turn, issues certain commands to the nonvolatile memory unit for effectuating the host's commands. The host identifies storage locations (or units), within the nonvolatile memory array (or unit) within which information is to be written to or read from using logical block addresses whereas the controller translates such addresses into physical block addresses for identifying the actual location within the nonvolatile memory unit in which the block to be addressed is located. Due to the characteristics of nonvolatile memory arrays, the controller circuit must erase an area of nonvolatile memory to which it has previously written prior to re-writing (or re-programming) to the same area. In some examples of nonvolatile memory units having floating gates, during programming, the state of a cell of the nonvolatile memory unit is changed from a logical state of '1' to a logical state of '0' because during erasure of a nonvolatile memory cell, the cell is programmed to a logical state of '1'. This is commonly used in nonvolatile memory units having NAND type cell structures whereas in other types of cell structures, such as NOR, the opposite logical states may be used for erase and programming.

The controller circuit currently includes a space manager block having a look-up-table (LUT) that is comprised of volatile memory cells, such as random access memory (RAM), for storing information relating to the blocks stored within the nonvolatile memory unit. This table is used for translating logical block addresses to physical block address, as will be discussed with respect to FIG. 1 shortly. This table is also used to search for free blocks within the nonvolatile memory unit and to maintain the status of the blocks for erasure thereof and other types of information. When power is interrupted to a system including the nonvolatile memory unit and the controller, the information maintained within the LUT is lost due to the volatile nature of the LUT. Thus, upon resumption of power to the system, information within the LUT is reconstructed using the information within the nonvolatile unit.

Referring to FIG. 1, an example of a prior art LUT 1 is shown to comprise rows and columns of volatile memory cells. Specifically, the LUT 1 includes two columns, one for storing address information and another for storing flag information. The address information is VPBA and is stored in the VPBA field 3 and the flag information is stored in the flag field 5. A VLBA 7 is used for addressing each of the rows of the LUT 1. In the example of FIG. 1, the number of rows is shown to be N−1, N being an integer value and representing the number of blocks within the nonvolatile memory unit. The LUT 1 typically resides within the controller, circuit and is used by the controller to translate a VLBA value to a VPBA value by looking up a VPBA 3 value based on the VLBA 7 value. The VLBA is used to address a row of the LUT 1 for finding a corresponding VPBA value in the VPBA 3 field of the addressed row. The controller circuit also looks up a corresponding flag 5 value to determine the status of the block on which it is to perform an operation. For example, to find a free or available block within the nonvolatile memory unit, the controller circuit will look up, using a VPBA value, a corresponding flag field indicating that the block, which is being identified by the VPBA, is 'unused'. Details of the operation of the LUT and related information are shown and explained in the U.S. patent application referred to and incorporated by reference hereinabove.

Currently, during operation, the user data field and extension field of a sector of information is erased at the same time, i.e. using a single erase command to erase both fields. That is, in prior art techniques, a single potential (or voltage level) is used to erase both fields and the single potential may be coupled onto one or more signals for effectuating erasure of both fields. For a better understanding, the reader is now referred to a block diagram of a prior art flash memory device 10, shown in FIG. 2 and referred to as the TH58512FT, manufactured by Toshiba, Inc. of Japan.

The device 10 includes a memory cell array 12 for storing information therein identified by rows and columns (not shown in FIG. 2) of the array 12. These rows and columns are identified by the I/O port 14 and the control signals 16, which are input and output signals to and from the device. The remainder of the blocks shown in FIG. 2 serve as control circuitry for controlling reading, writing and erase operations performed on the array 12. The user data field and extension field of each of the sectors of information reside in one row of the array 18.

It is of particular importance to note that the array 12 is constructed within a main well 18. To selectively erase a block, the voltage applied to well 18 is increased to a voltage level, referred to as, Vpp. This voltage level is generated by the high voltage (HV) generator 20 and included within the signals 22. While not shown in FIG. 2, the control gates of the block to be erased are held at a predetermined erase voltage and the control gates of blocks that are not being erased remain floating or are brought to a non-disturbing voltage (a voltage that avoids erasure and programming of the cell). This, in turn, causes the user data field and extension field of a sector to be erased together. In fact, typically, the user data fields and extension fields of all of the sectors of a block are erased together.

The problem with this approach is that due to the erasure of the user data field with the extension field, there is not much flexibility allowed for organizing the information within the array 18. Multiple updates (or modifications) of the extension field may be performed without affecting the contents of the user data field in the row of the memory unit in which the extension field being modified resides. Additionally, the information maintained within the LUT of the controller circuit is fairly extensive and cannot be trimmed to allow for a smaller volatile memory capacity and therefore less expensive controller circuit.

Therefore, there is a need for a system and method of controlling a nonvolatile memory unit using a controller circuit in a way so as to afford flexibility in organizing information stored within the nonvolatile memory unit and to allow for the manufacturing of an inexpensive controller circuit by using smaller-capacity volatile memory therein.

SUMMARY OF THE INVENTION

Briefly, an embodiment of the present invention includes nonvolatile system for controlling erase operations performed on a nonvolatile memory array comprised of rows and columns, the nonvolatile memory array stores digital information organized into blocks with each block having one or more sectors of information and each sector having a user data field and an extension field. A controller circuit is coupled to a host circuit and is operative to perform erase operations on the nonvolatile memory array, the controller circuit causes erasure of a particular sector of information having a particular user data field and a particular extension field wherein particular user field is erased separately from the particular extension field.

These and other features and advantages of the present invention will become well understood upon examining the figures and reading the following detailed description of the invention.

IN THE DRAWINGS

DETAILED DESCRIPTION OF THE PREFERRED EMBODIMENTS

Figure 3:
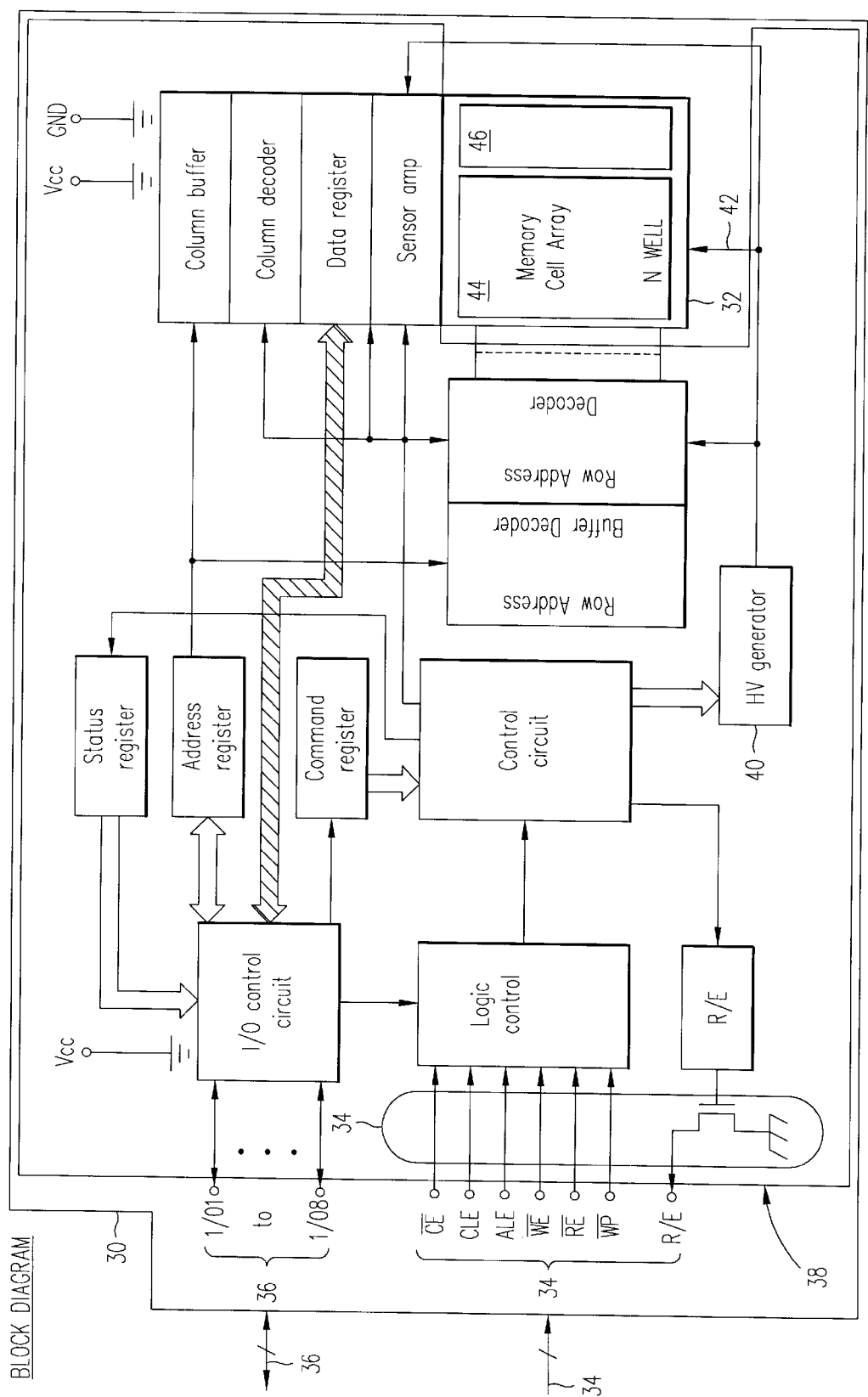
FIG. 3 shows a nonvolatile memory device 30 in accordance with an embodiment of the present invention.

Referring now to FIG. 3, a nonvolatile memory device 30 is shown to include a nonvolatile memory cell array 32, an I/O port 36, control bus 34, and nonvolatile array control circuitry 38. The I/O port 36 and control bus 34 provide information to and from the device 30. While in FIG. 3, the I/O port 36 is shown to include eight input and output (I/O)

lines, in other embodiments of the present invention, other number of lines may be employed. The I/O port 36 is used to convey information such as command, address and data to the device 30. For example, a read, write, erase and/or read-verify command may be coupled onto the I/O port 36. These operations are ultimately conducted on a particular area of the array 32, as identified by the control circuitry 38 through the use of information from the I/O port 36 and control bus 34. Additionally, signals within the control bus 34, in combination with the I/O port 36 may be used to address a particular area within the array 32. For a more detailed discussion of the operation of a nonvolatile memory device, the reader is directed to the data specification of the TH58512FT product, manufactured by Toshiba Corporation, which is incorporated herein by reference as though set forth in full.

Information stored within the array 32 of device 30 is organized into sectors and blocks as discussed hereinabove. The array 32 is comprised of rows and columns (not shown in FIG. 3), with each row used for storing user data and extension fields of a sector of information. The array 32 is structured to have two wells, a mainwell 44 and an extensionwell 46. The potential (or voltage level) applied to each of these wells is controlled separately by two signals (among the many signals within the signals 42) applied to the array 32 for causing separate erasure of the user data field and the extension field of the sectors within the array. In one embodiment of the present invention, these signals are Vw1 and Vw2. One such signal is used for effecting erasure of the user data field and another signal is used for effecting erasure of the extension field. Separating the wells of the array 32 allows for such separate erasure of the fields of the sectors. Two erase commands are coupled to the I/O port 36 when erasing a block, one erase command causes erasure of the user data field and another erase command causes erasure of the extension field.

In response to the user data field erase command, the Vw1 signal is increased to a level of Vpp (an example of a Vpp level is 20V)and the Vw2 signal is held at a non-erase voltage level (an example of non-erase level is 0V) to prevent erasure of the extension field corresponding to the user data field being erased. Voltage applied to the control gate of the block selected for erasure is held at an erase voltage level (typically 0 volts) while the control gates of other blocks (not selected for erasure) remain floating or brought to a non-disturbing level. As will be explained with respect to other figures herein, the Vw1 and Vw2 signals are coupled to two different enable signals, one enable signal being provided to a user data field cell and another being provided to an extension field cell for effectuating separate erase operations thereon.

In response to the extension field erase command, the Vw2 signal controlling the potential (or voltage level) applied to the extension-well of the selected block is increased to Vpp and Vw1 is held at a non-erase potential (typically 0V). The voltage of the control gate of the selected block is held at an erase voltage level and the control gate of other blocks not selected for erasure remains floating or brought to a non-disturbing level.

Further details of the effect of such separation are presented in figures and discussions to follow. However, while erasure of the user data field is performed separately from the extension field, reading from and writing to both fields can be conducted in a manner similar to that of prior art techniques. For example, the user data field and the extension field of a sector can be read simultaneously or separately and likewise, the user data field and extension field of a sector can be written to simultaneously or separately.

Figure 1:
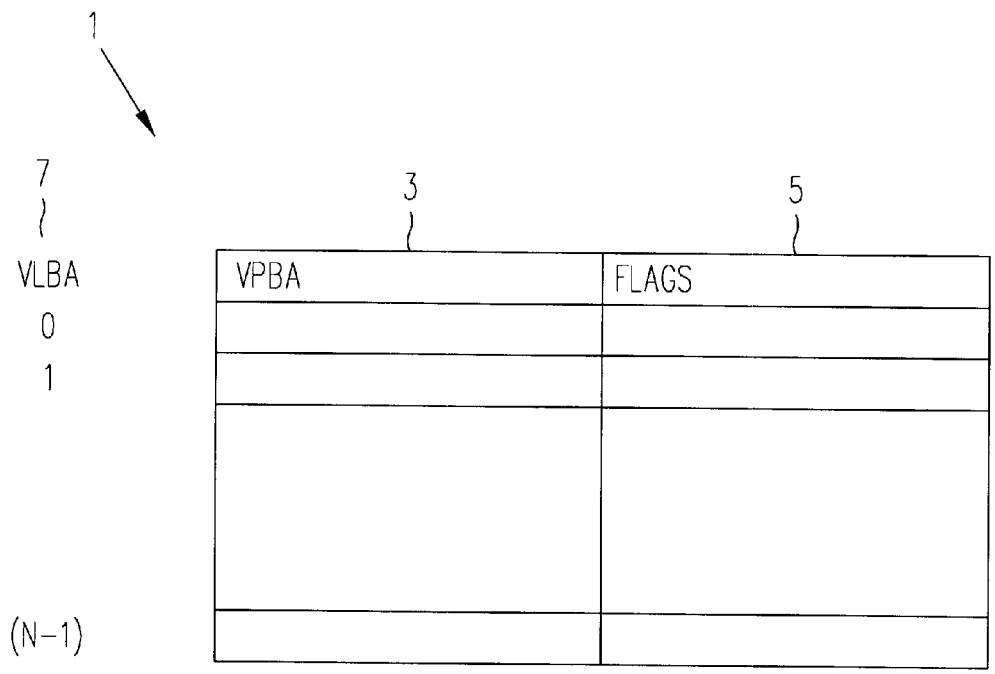
FIG. 1 shows an example of the contents of a prior art LUT 1.
Figure 4A:
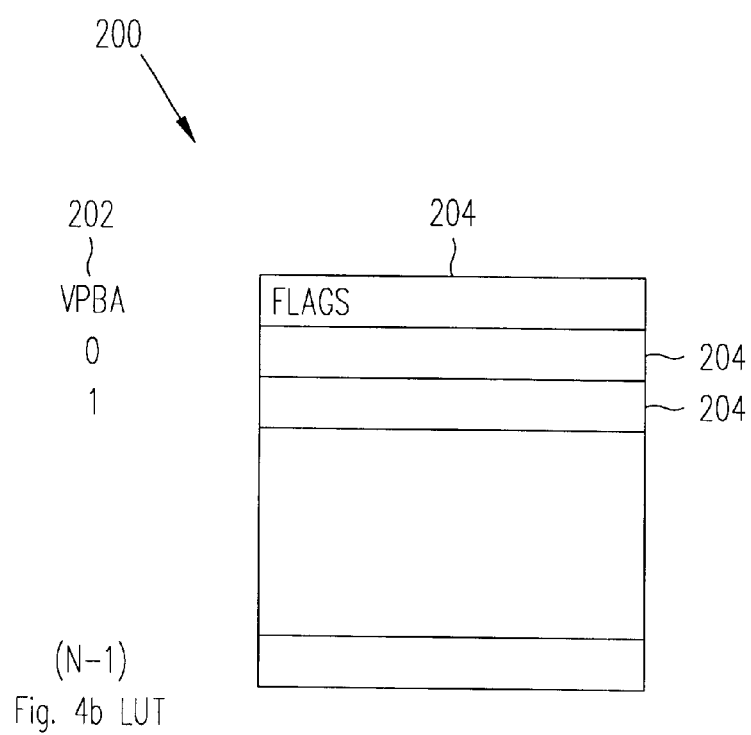
FIG. 4a shows a LUT 200 in accordance with an embodiment of the present invention.
Figure 2:
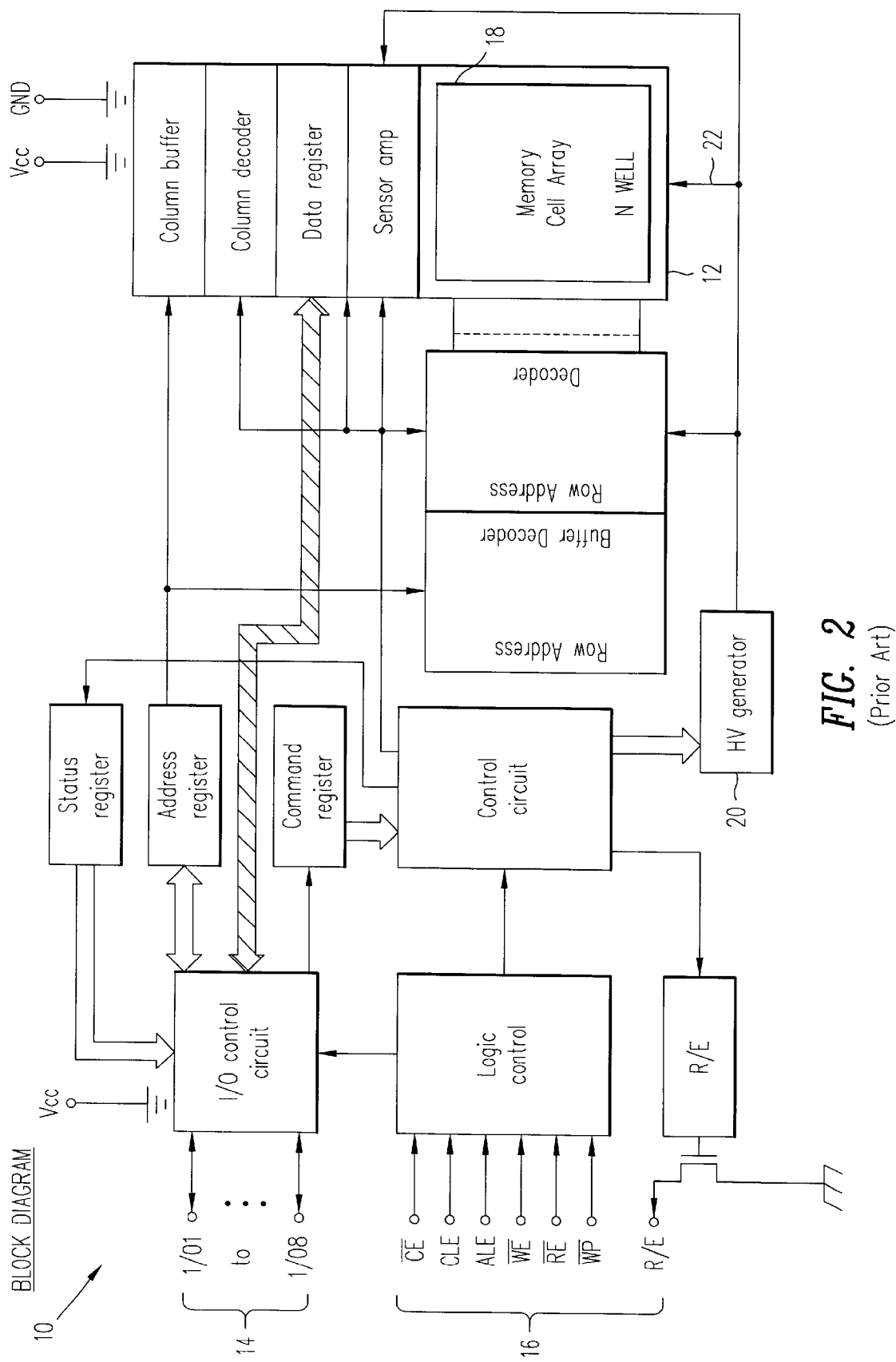
FIG. 2 shows a block diagram of a prior art nonvolatile memory device.
Figure 4:
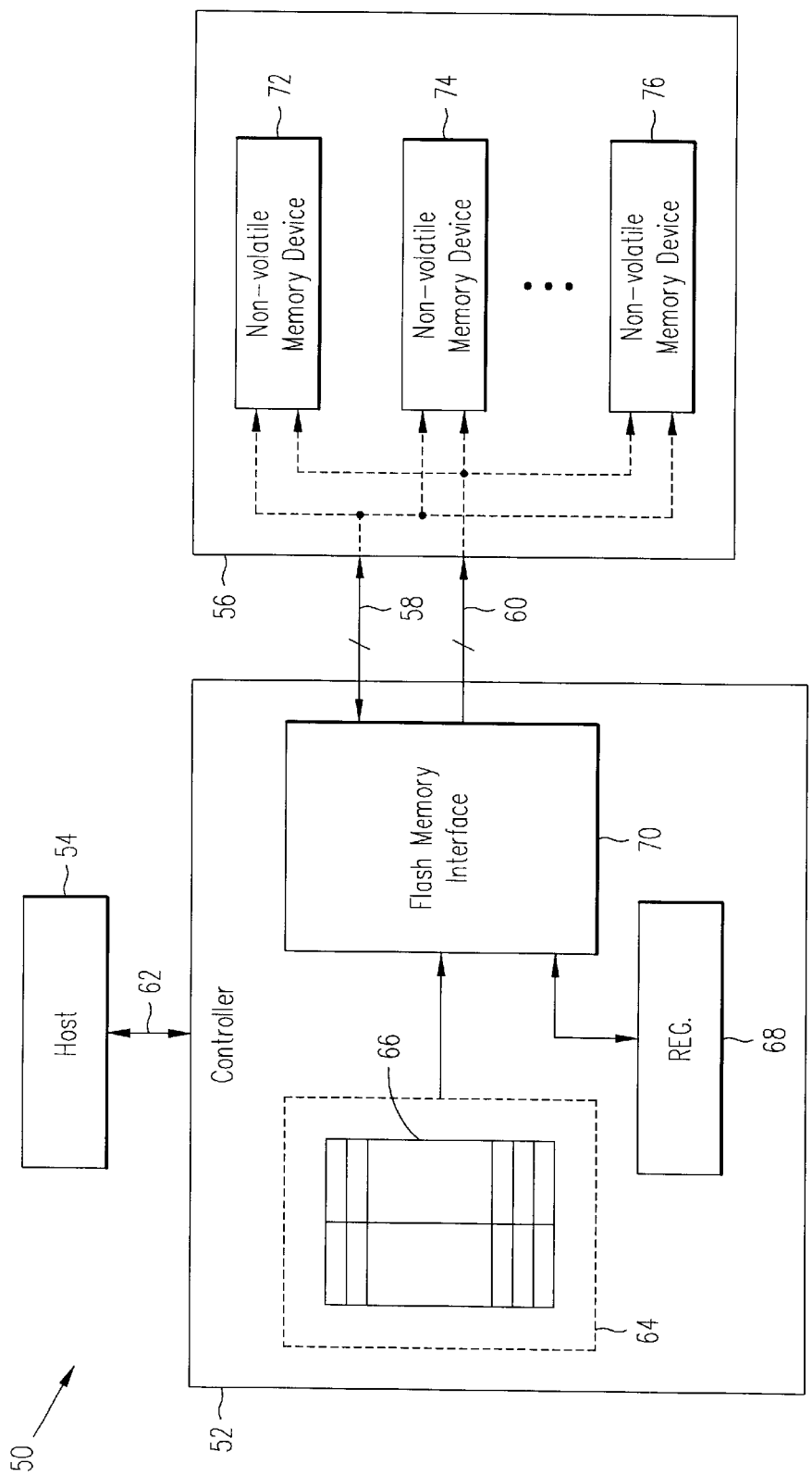
FIG. 4 illustrates a nonvolatile memory system 50 including the nonvolatile memory device and a controller circuit 52 in accordance with an embodiment of the present invention.

Referring now to FIG. 4, a nonvolatile memory system 50 is shown to include a host circuit 54, a controller circuit 52 and a nonvolatile memory unit 56. The controller circuit 52 resides either internally or externally to the host circuit 54 and is shown to be coupled to the host circuit 54 through the host signals 62. The host signals are used for coupling various types of information from the host circuit 54 to the controller circuit 52, such as command, address, data and other related information, such as control signals. Those skilled in the art realize that there are various types of interfaces, defined by the industry-at-large, for effectuating such coupling. For example, a command, initiated by the host and coupled onto the host signals 62, may be of a type referred to as 'physical interface' or 'logical interface'. Examples of logical interface are the ATA and PCMCIA interfaces and an example of a 'physical interface' is the memory stick. When using a physical interface, the host circuit commands are directly directed at a particular circuit, such as a memory unit. Accordingly, read and write commands are issued by the host circuit directly these commands to be applied to one or more addresses within the memory unit (physical block address). Whereas, when using logical interface, the host commands are accompanied by address that are not necessarily a direct address into the memory unit, rather they need to be translated into physical addresses. In the logical interface application, the host-provided address are commonly referred to as logical block addresses.

The controller circuit 52 is coupled to the nonvolatile memory unit 56 through the I/O port 58 and the control signals 60. The memory unit 56 includes one or more nonvolatile memory devices. In the embodiment of FIG. 4, the nonvolatile memory unit 56 is shown to include a number of nonvolatile devices, namely 72, 74 and 76. In fact, the memory unit 56 may include any number of nonvolatile memory devices. Each of the shown devices 72–76 can be similar to the device 30 (shown in FIG. 3). Furthermore, each of the devices 72–76 include a nonvolatile memory array, such as memory array 32 shown in FIG. 3, having any type of nonvolatile memory cells known or used by the industry, such as flash, EEPROM or any other type of nonvolatile memory cell.

The controller circuit 52 is shown to include a space manager block 64, a flash interface circuit 70 and a temporary register 68. The controller circuit includes further circuits and structures, which are not shown in FIG. 4, yet are shown and discussed in other related patent applications, all of which are identified and incorporated herein by reference, as stated hereinabove.

The space manager block 64 is shown to include a LUT. 66 for storing information relating to the information stored in the memory unit 56. Details of this information is discussed in detail with respect to other figures.

In FIG. 4, the space manager block 64 is shown coupled to the flash interface circuit 70 for communicating to the memory unit 56, through the I/O port 58 and the control signals 60. Through the flash interface circuit 70, information is passed back and forth between the controller circuit 52 and the memory unit 56. The space manager block 64 uses the LUT 66 to identify blocks within the memory unit 56 to which information is to be read or written or blocks needing to be erased. In this respect, the flash interface circuit 70 serves as an intermediary circuit for communicating such information between the controller circuit 52 and the memory unit 56. Occasionally, the need arises for certain information from the memory unit 56 to be saved in the temporary register 68 for subsequent access thereof. This will be apparent with respect to figures and discussions to follow.

In operation, the controller circuit 52 receives commands from the host, through the host signals 62, to perform certain operations on the memory unit 56. For example, the host circuit 54 can instruct the memory unit 56 to be written to or read from, in which cases, the controller circuit 52 carries out the host's instruction by performing certain operations to identify the particular area, i.e. block and sectors, to which information will be written or read. Accordingly, the controller circuit 52 maintains the status of the blocks within the memory unit 56. This status information is maintained within flag fields of the LUT 66. For example, the flag field of a particular block can indicate that the particular block is 'free' or available for programming. Other states of the flag field are 'old' indicating that the particular block includes stale data and therefore should be erased before being re-written (or re-programmed). Another state of the flag field is 'used' indicating that the particular block includes current (or valid) user data. The flag field information is replicated in the flag fields of the memory unit 56, as will be explained further shortly, for the purpose of reconstructing the LUT 66 after a power interruption.

In FIG. 4a, an example of the contents of a LUT 200 is shown in accordance with an embodiment of the present invention. The LUT 200 is comprised of rows and columns of volatile memory cells, the rows of which are addressed by virtual physical block address (VPBA) values 202. Each of the VBPA rows addresses a flag field 204. A flag value, stored in the flag field 204, indicates the state of the VPBA used to address the flag field within the corresponding VPBA row. The value in each of the flag fields is indicative of the state of the VPBA field of the corresponding row in which the flag field is stored. Thus, the size of the LUT is considerably smaller than that of prior art LUTs. The information for mapping VLBA to VPBA is now stored in the extension field of the sectors within the nonvolatile memory unit in a manner shown and explained hereinbelow.

Figure 4B:
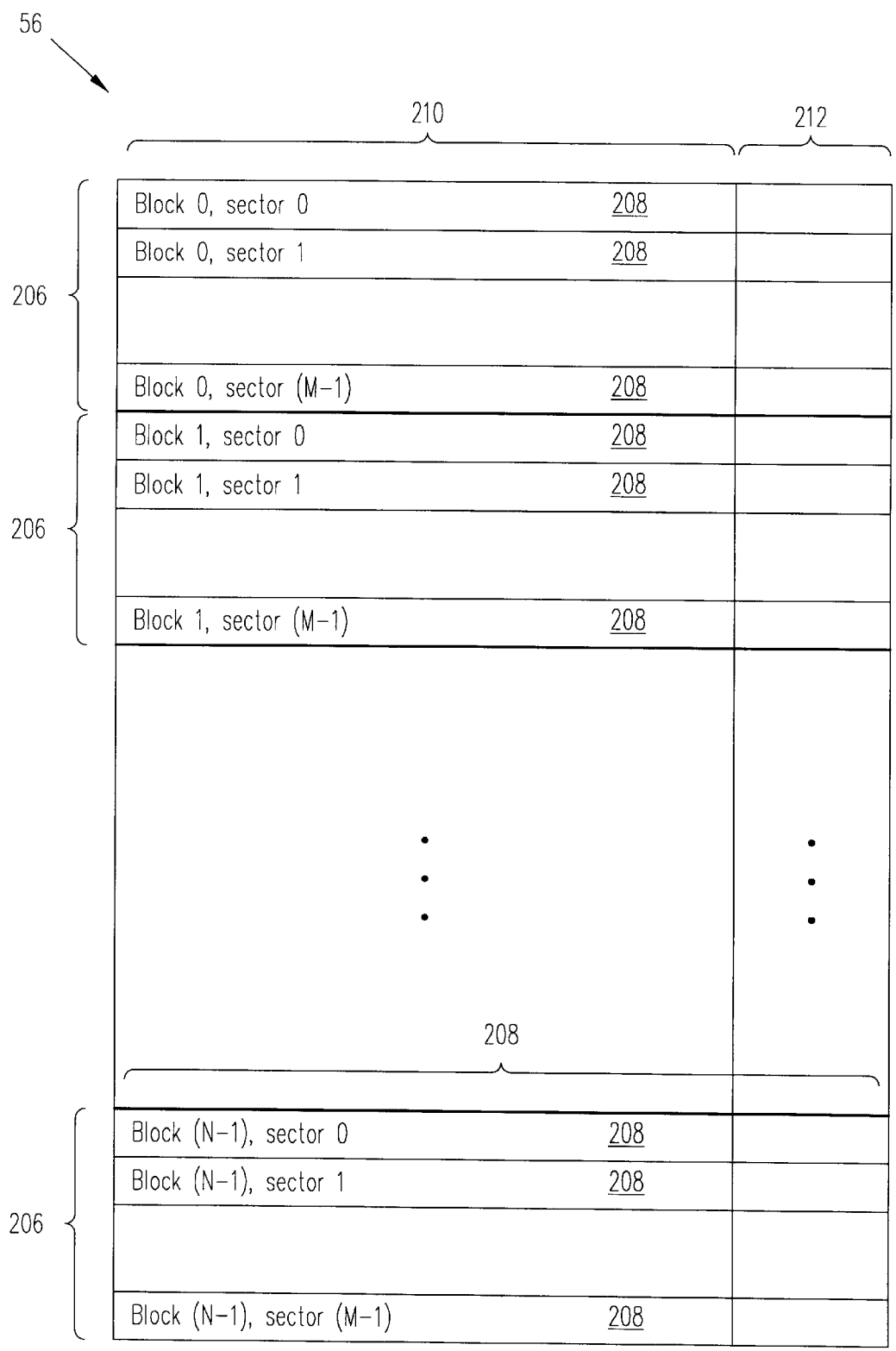
FIG. 4b shows the organization of the nonvolatile memory unit 56 in accordance with an embodiment of the present invention.

In FIG. 4b, the organization of information stored within the nonvolatile memory unit 56 is shown in accordance with an embodiment of the present invention. The memory unit 56 is shown to include N blocks (N being an integer value and the blocks shown in FIG. 4b being numbered from 0 to N-1), each block 206 comprising of M sectors (M being an integer value and the sectors of each of the blocks 206 being numbered from 0 to M-1). Each sector 208 comprises of a user data field 210 and an extension field 212. The blocks of the memory unit 56, in FIG. 4b, are addressed by VPBA values.

Figure 4C:
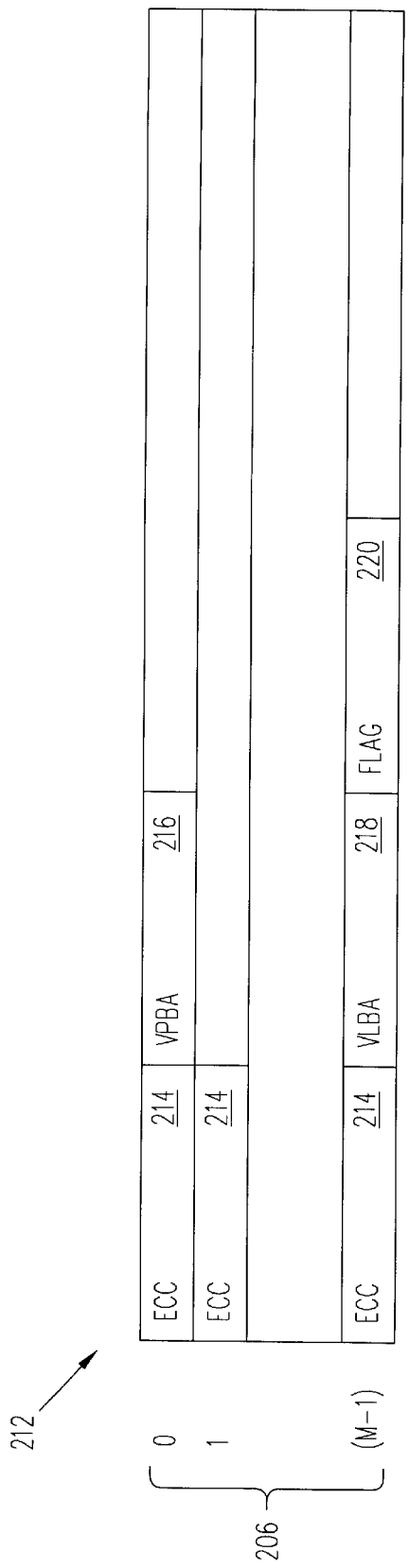
FIG. 4c shows the organization of the extension fields 206 within the memory unit 56 in accordance with one embodiment of the present invention.

FIG. 4c shows the organization of information within each of the extension fields 212 of a block 206 in accordance with an embodiment of the present invention. Within each of the extension fields, there are address and non-address fields. One of the non-address fields is an ECC field 214. Within the extension field 212 of the first sector (sector 0) of each of the blocks 206, there is further stored a VPBA field 216. In the last sector (sector M-1) of each of the blocks 206, in addition to the ECC field 214, there is a VLBA field 218 and a flag field 220. The VLBA field 218 is for storing a VLBA value corresponding to the physical address of the block within which the VLBA value is stored. The flag field 220, being another nonaddress field, is for storing flag information relating to the status of the block within which the flag information is stored. Examples of the status of the block is "free/used" for indicating whether or not the block is available and "old/new" for indicating whether or not the block contains invalid user data, as discussed in above-identified related applications.

The VPBA field 216 stores VPBA for identifying a physical block, i.e. a block within the memory unit 56. To find a VPBA corresponding to a particular VLBA, the extension field of the block having an address matching the particular VLBA is read (by the controller circuit).

The VLBA field 218 maintains the VLBA value corresponding to the block. Each time the VLBA is re-written, the corresponding VPBA may change and a read-modify-write operation is thus performed on the extension field of the block having an address matching the particular VLBA to update the VBPA field. It should be noted that the VLBA being re-written will be assigned to a block that may be the same or a different block than that which includes the VPBA field to which a read-modify-write operation is being performed. During the read-modify-write operation, the extension field is read and its contents are stored within the temporary register 68 (shown in FIG. 4). Then the extension field is erased and the affected fields (in this case VPBA field) along with those fields that were preserved (in this case the ECC field) are written back to the extension field. That is, the VPBA field is updated or modified and then stored back into the extension field of the block identified by the re-written VLBA while the ECC field and any other field(s) are preserved.

Figure 4D:
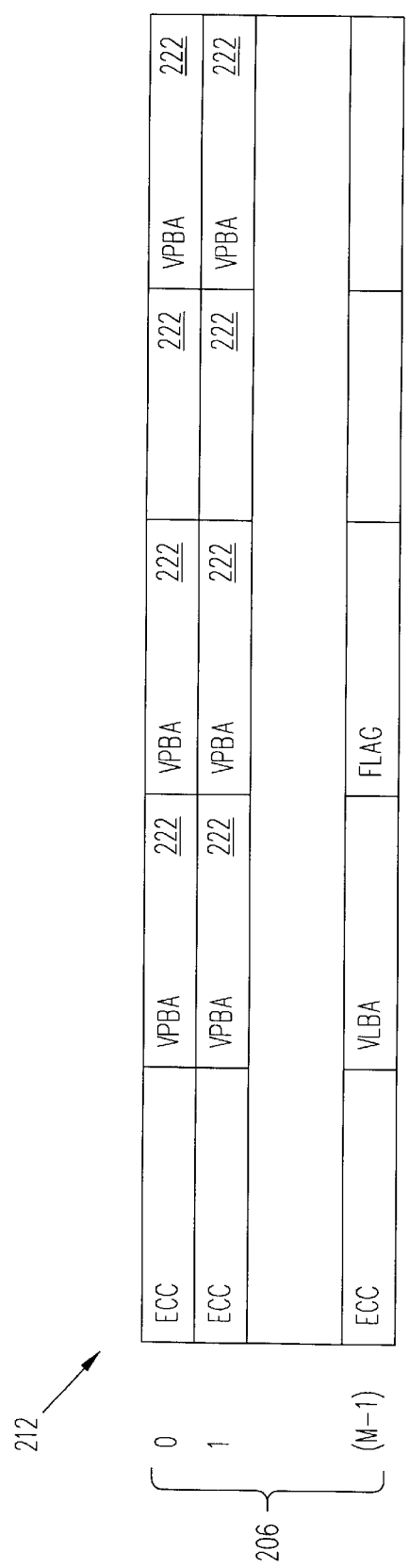
FIG. 4d shows the organization of the extension fields 206 within the memory unit 56 in accordance with another embodiment of the present invention.

FIG. 4d shows the organization of the information stored within the extension field 212 in accordance with another embodiment of the present invention. In this embodiment, each of the extension fields of all of the sectors within the block 206, except for the last sector (sector M-1) of the block, includes multiple VPBA fields 222 for storing multiple VPBAs. In one example, the extension field includes 16 bytes, 4 of which comprise ECC and six VPBA fields for storing 6 VPBAs. In this manner, the read-modify-write operation is avoided until all of the VPBA fields of the extension field are used. When the VLBA is re-written and there is no free VPBA field within the extension field available for writing, a read-modify-write operation is performed. That is, the extension field is read and stored in the temporary register 42, the extension field is then erased and modified to include the affected fields (VPBA field) while preserving other fields. In this embodiment, the controller circuit reads the extension field and determines the most recent VPBA field being used. The most recent VPBA field is identified by examining the VPBA fields for the first VPBA field that is yet not programmed. In one embodiment of the present invention, a non-programmed value is 'FFFF' (in hexadecimal notation). The most recent VPBA field is the VPBA field preceding the first VPBA field having a non-programmed value. In the example where the non-programmed value is 'FFFF', if among 6 VPBA fields, numbered VPBA 0 to VPBA 5, VPBA 2 is the first to have stored therein a FFFF value, then the previous VPBA, i.e. VPBA 1 is the most recent VPBA field and VPBA 2 is the next free field for storing a VPBA value. If there is no VPBA field having a value of 'FFFF', then the most recent VPBA field is the last VPBA field and there is no free VPBA field available.

In the embodiment of FIG. 4d, each time the VLBA is re-written, the corresponding VPBA may change and the VPBA is written to a next free VPBA field.

In alternative embodiments of those which are shown in FIGS. 4c and 4d, the VPBA need not be located in the first sector of a block. The VPBA field(s) may be located in any of the sectors within a block. Similarly, the VLBA and flag information need not be located in the last sector of a block and can be located in any of the sectors of a block.

Upon power-up or after a power interruption, the information stored in the flag field of the extension field of the memory unit is used to re-construct the contents of the LUT within the space manager block of the controller circuit 52 (shown in FIG. 4). Manipulation of the contents of the LUT 66 and the memory unit 56 will be discussed with reference to an example of a write operation to one of the blocks of the memory unit 56 as set forth below.

It is important to note that the memory devices support separate erasure of user data and extension fields, as discussed hereinabove.

Referring back to FIG. 4, during a write, read or erase operation, a write, read or erase command is respectively coupled onto the I/O port 58 followed by an address and user data if a write operation is to be performed. The control signals 60 carry information such as chip enable (for selection of a particular nonvolatile memory device) and further read, write or erase operation information.

Figure 5:
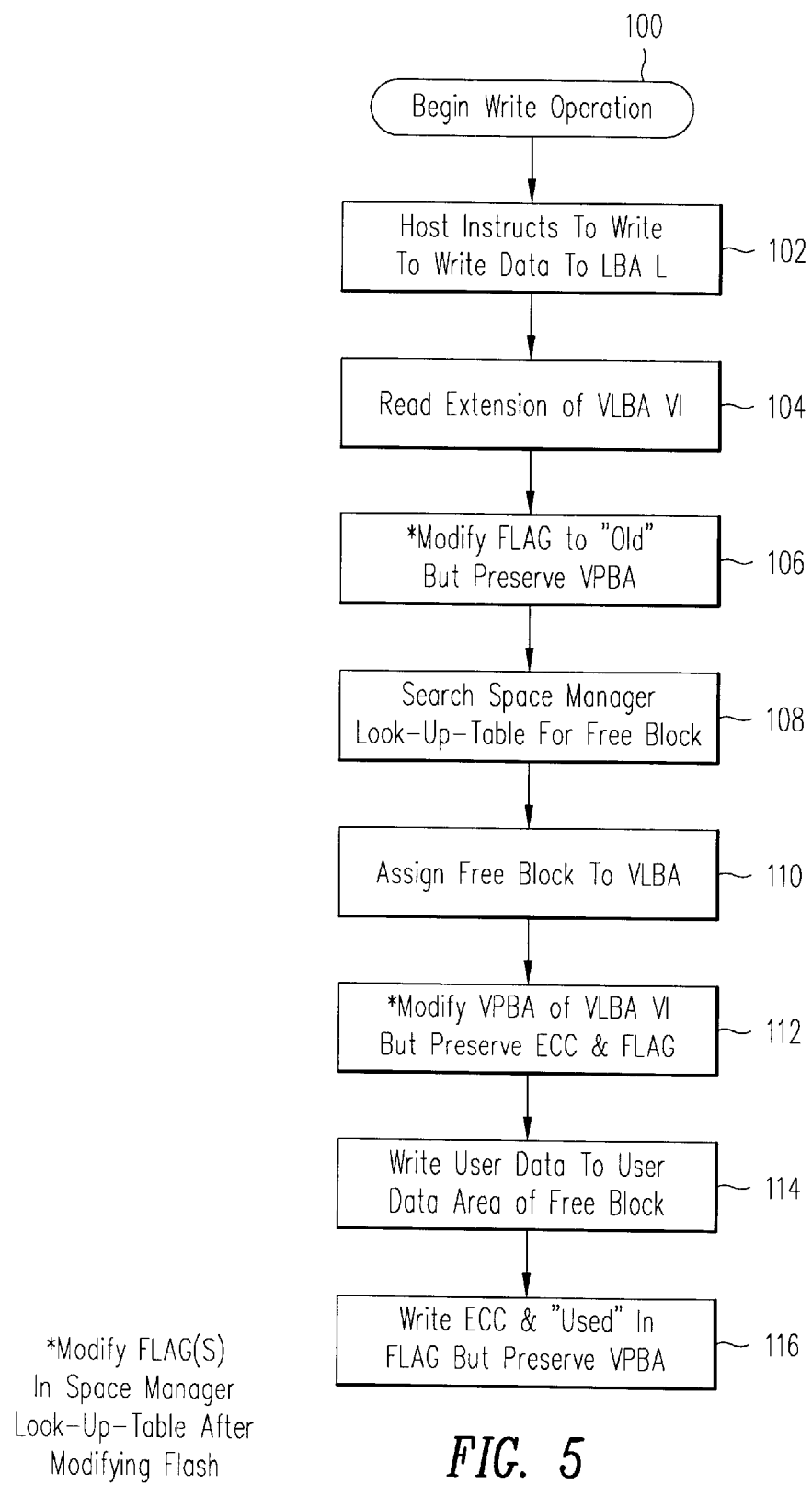
FIG. 5 shows a flow chart of the steps processed by the controller circuit 52 (shown in FIG. 4) during a second write operation to the same LBA.

In FIG. 5, a flow chart is shown of the steps processed by the controller circuit 52 (shown in FIG. 4) during a write operation. At step 100, such a write operation is shown to begin. At step 102, the host circuit 54 instructs the controller circuit 52 to write (or program) user data to LBA L, which, as previously indicated hereinabove, is translated to VLBA V1 and offset 01. Next, at step 104, the extension field of the physical block having a value V1 (same as VLBA) is read and the most recent VPBA field and the next free VPBA field are identified. Note that the current user data is stored at the location pointed to by the most recent VPBA field. Next, the flag field of the block at an address identified by the most recent VPBA field is changed to 'old', at step 106. Additionally, the flag field of the corresponding row (or VLBA) of the LUT 66 is also modified to reflect that the block is 'old'.

Next, at step 108, a free block is located wherein the user data provided by the host circuit and being written to the same LBA is to be placed. To do so, the space manager block 64 searches the LUT 66 to locate a block that has a flag field status of 'free'. When a free block is located, the VPBA of the block is assigned to the VLBA, at step 110. At step 112, if there is a free VPBA field, the extension field of the VPBA V1 is updated by writing the address of the free block to the next free VPBA field. If there is no free VPBA field available, the extension field is read in the temporary register 68, modifying the temporary register by setting all VPBA field values equal to 'FFFF', changing the VPBA field to a free block, erasing the extension field and writing back the information stored within the temporary register to the extension field.

Next, at step 114, the user data, provided by the host circuit, is written to the user data field of sector o1 of the free block within the memory unit 56 and subsequently, at step 116, the ECC corresponding to the user data that was just written is written into the ECC field of sector o1 of the free block and the flag field of the same block are modified to indicate a status of 'used' but the VPBA field is preserved. Thereafter, the LUT 66 is modified to reflect the 'used' status of the flag field of the free block indicating that it is no longer free.

Figure 6:
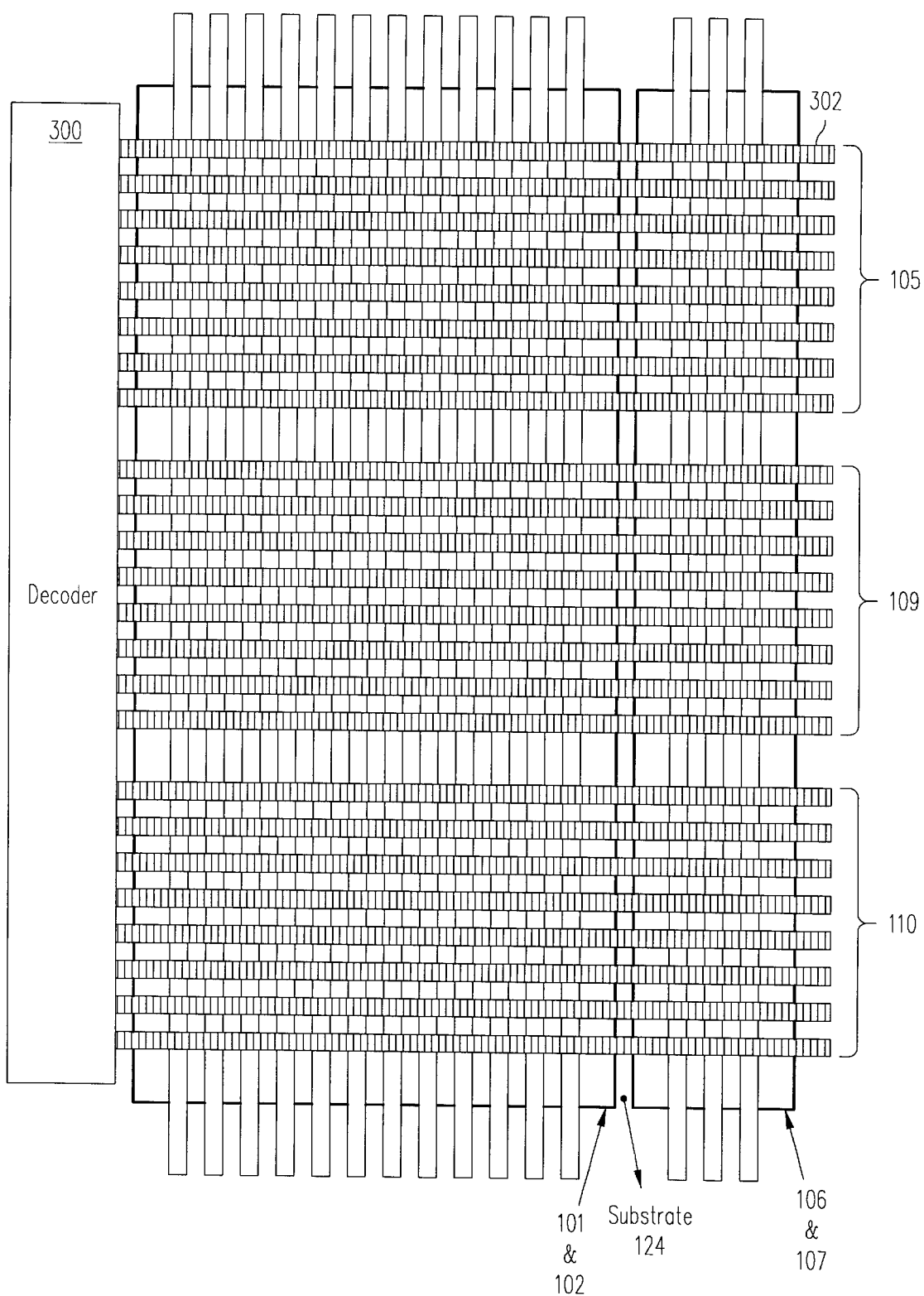
FIG. 6 shows a top view of an embodiment of a NAND nonvolatile memory cell for separately erasing same, as may be used in the nonvolatile memory device 30 of FIG. 3.

FIG. 6 shows the top view of a NAND type of flash cell structure 200 in accordance with one embodiment of the present invention. NAND cells are commonly used in non-volatile memory arrays for storage of information. The NAND cell structure 200, shown in FIG. 6, allows for erasure of one group of cells while avoiding erasure of another group of cells and thus may be used in the embodiment of FIG. 3, shown herein.

In FIG. 6, a decoder 300 is shown coupled to a plurality of blocks, i.e. blocks 105, 109 and 110. It should be clear that while a few blocks are shown in FIG. 6, many more may be included in a nonvolatile memory unit. In FIG. 6, each of the blocks include a plurality of control gates 302. Each control gate is used for a sector within a block.

In FIG. 6, two different p-wells are used to erase the nonvolatile (or EEPROM or flash) cells. A portion of the cells having control gates in common are erased while a different portion of the cells with the same control gates remain un-erased. This is achieved by having two sets of p-well and n-well combinations. One such set is the p-well 102 and n-well 101 and another set is p-well 107 and n-well 106. Before discussing the way in which this is achieved, it should be understood that in FIG. 6, a p-well 102 is connected to an n-well 101. Similarly, a p-well 107 is connected to an n-well 106. In each of these cases, the n-wells isolate the p-wells from the substrate, as will become more clear in FIG. 6a. In essence, the n-well 101 isolates the p-well 102 from the p-substrate 124 and similarly, the n-well 106 isolates the p-well 107 from the p-substrate 124.

A brief summary of the way in which a nonvolatile memory cell, having a floating gate, is erased is now explained. To erase cells, a combination of p-well and n-well is raised to a high voltage level by using a voltage pump (such as discussed with respect to FIG. 3 regarding HV). The control gates of the cells that are to be erased are caused to be connected to ground by means of a decoder. The control gates of the cells in the blocks 109 and 110 that are not to be erased are brought to a non-disturbing voltage while the control gates of the cells in the block 105 are caused to be connected to ground to be erased. In FIG. 6, for example, if the cells inside the p-well 102 and n-well 101 and in block 105 are to be erased, the control gates 302 of the cells of the block 105 are caused to be connected to ground through a decoder, otherwise, if they are not to be erased, their control gates are brought to a non-disturbing voltage. Similarly, if the cells inside the p-well 107 and the n-well 106 and in block 109 are to be erased, the control gates of the cells within the block 109 are caused to be connected to ground through a decoder, otherwise, they are brought to a non-disturbing voltage.

During an erase operation, for example, erasure of cells that are inside the p-well 102 and the n-well 101, within the block 105, is caused by the control gates of the cells within the block 105 to be grounded and high voltage to be applied to the p-well 102 causing the electrons on the floating gates to tunnel to the p-well 102.

Referring to the embodiment of FIG. 3, the p-well 102 and the n-well 101 extends to all of the cells of the mainwell 44 while the p-well 107 and the n-well 106 extends across all of the cells of the extension well 46 thereby allowing for separate erasure of the mainwell 44 and the extension well 46. Where user data is stored in the cells that are in the mainwell 44 of the array 32 (in FIG. 3) and extension information is stored in cells that are in the extension well 42 of the array 32, separate erasure of user data and extension information is effectuated, as described above.

Figure 6A:
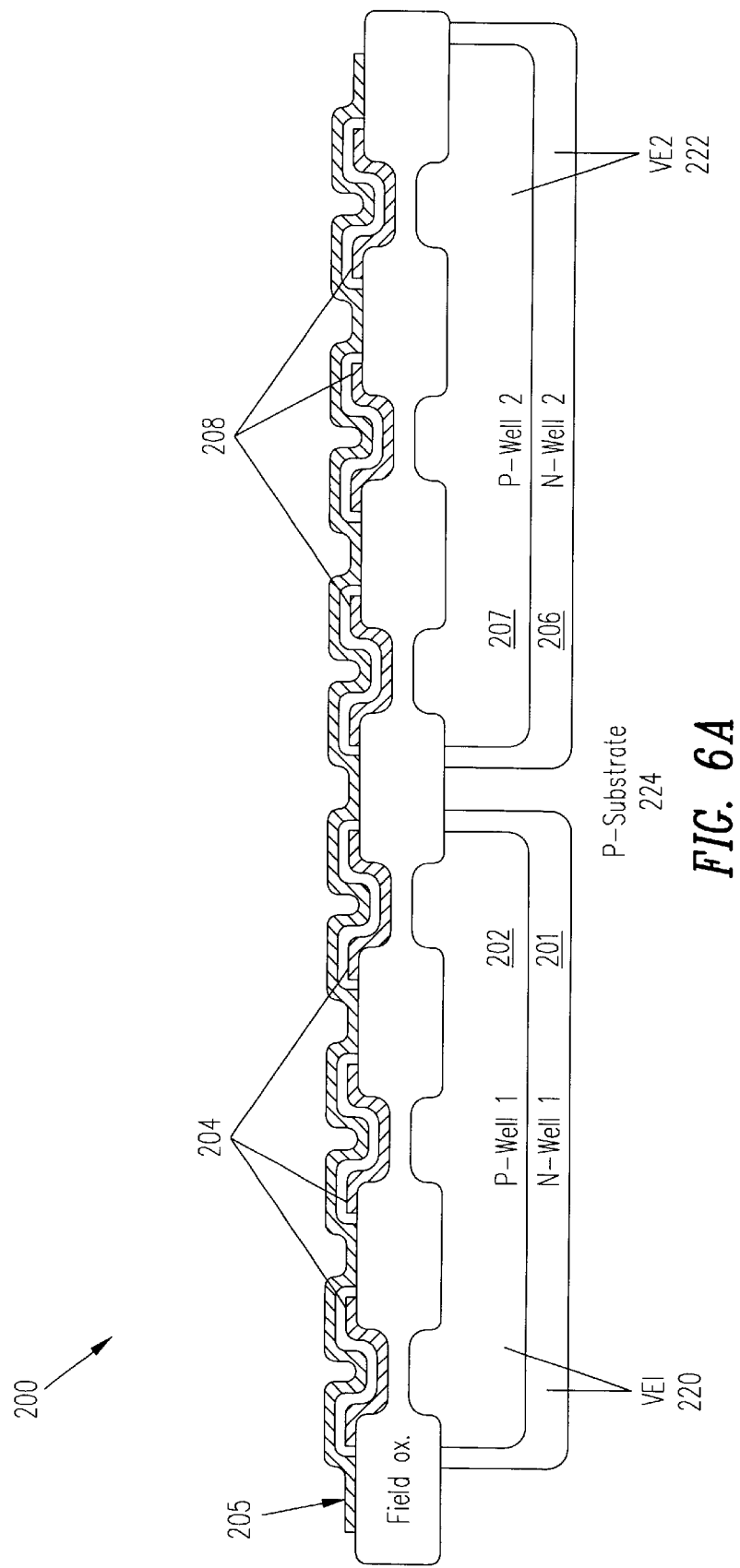
FIG. 6a shows a side view of the embodiment of FIG. 6.

FIG. 6a shows the cross sectional view of the cells in FIG.6 having common control gates. In this view, the common gate 205 extends over both p-wells 202 and 207. The floating gates are shown as gates 204 and 208. The n-well 201 isolates the p-well 202 from substrate 224, and n-well 206 isolates the p-well 207 from substrate 224. The signal Ve1 220 controls the potential of p-well 102 and the signal Ve2 222 controls the voltage of the p-well 107.

In another technique the erasure of the cells can be prevented by floating the common gates of the cells located inside the high voltage p-well. In this case, the cells sharing a common control gate and whose common control gate is grounded are erased while the cells with floating common control gates remain un-disturbed. This requires that the common gates of the cells for the two p-wells to be separated. This is shown in FIG. 7.

Figure 7:
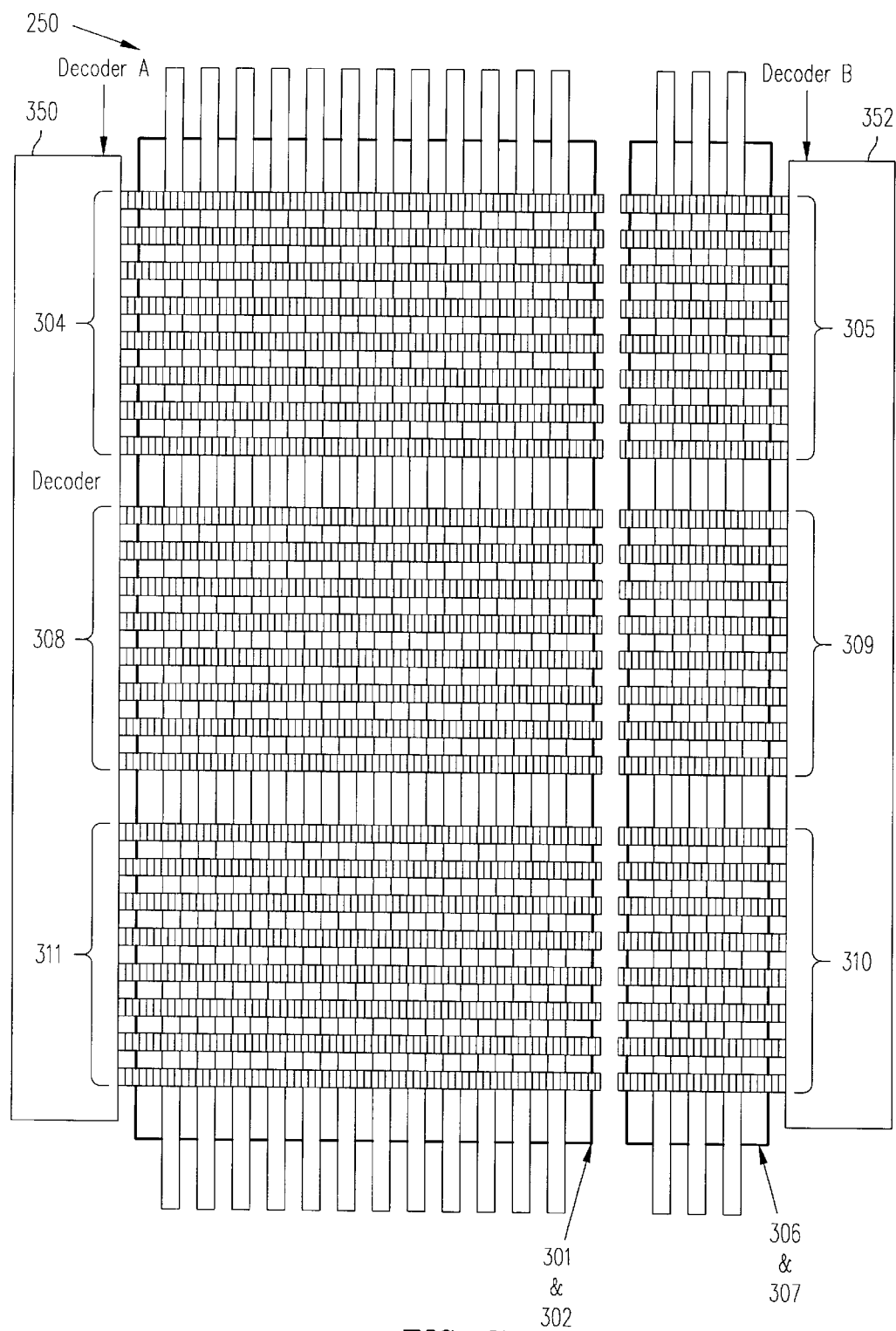
FIG. 7 shows another embodiment of NAND memory cells being separately erasable, as may be used in the nonvolatile memory device 30 of FIG. 3.

In FIG.7, another embodiment is shown of NAND structure cells. In FIG. 7, there is shown a top view of the cells. In FIG. 7, if the p-well 306 and the n-well 307 are raised to high voltage while the p-well 301 is at ground voltage, the cells in the block 305 can be erased by bringing the control gates in the block 305 to ground while the cells in the blocks 309 and 310 will not erase when the control gates of the blocks 309 and 310 are left floating. The cells in the blocks 304, 308 and 311 will not erase in any case since their common p-well is at ground potential.

Figure 7A:
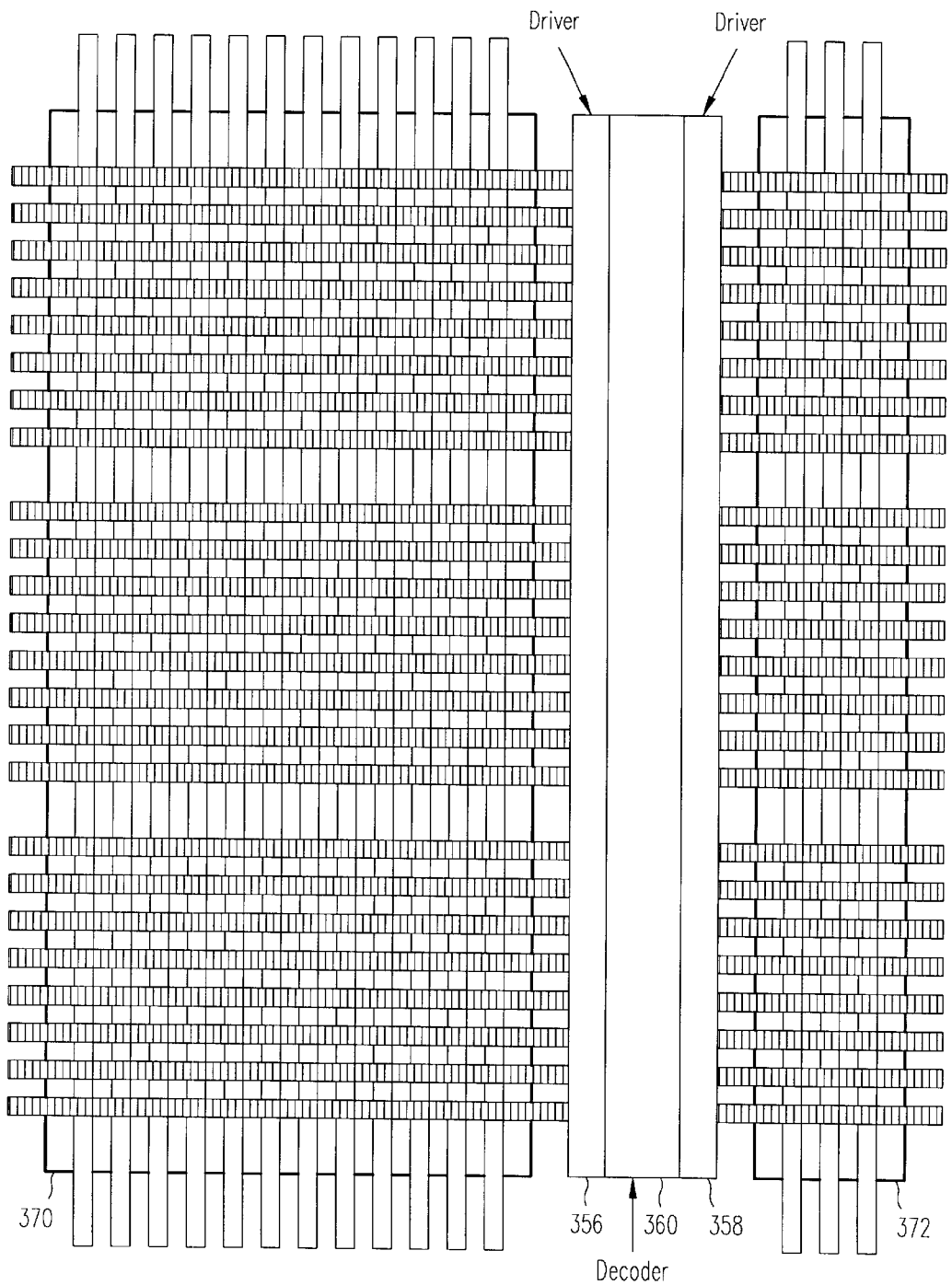
FIG. 7a shows yet another embodiment of NAND memory cells being separately erasable, as may be used in the nonvolatile memory device 30 of FIG. 3.

To separate the control gates for the two different p-wells, the control gates have to be either driven with two different decoders, 350 and 352, as is shown in FIG. 7 or additional drivers are needed to drive the control gates of the extension well 372 separately from the control gates of the mainwell 370 of the memory, as shown in FIG. 7a. In FIG. 7a, a set of drivers 356 is used to drive the mainwell 376 while another set of drivers 358 is used to drive the extension well 372. There is however, one decoder circuit 360 used for both the mainwell 370 and the extension well 372.

Figure 7B:
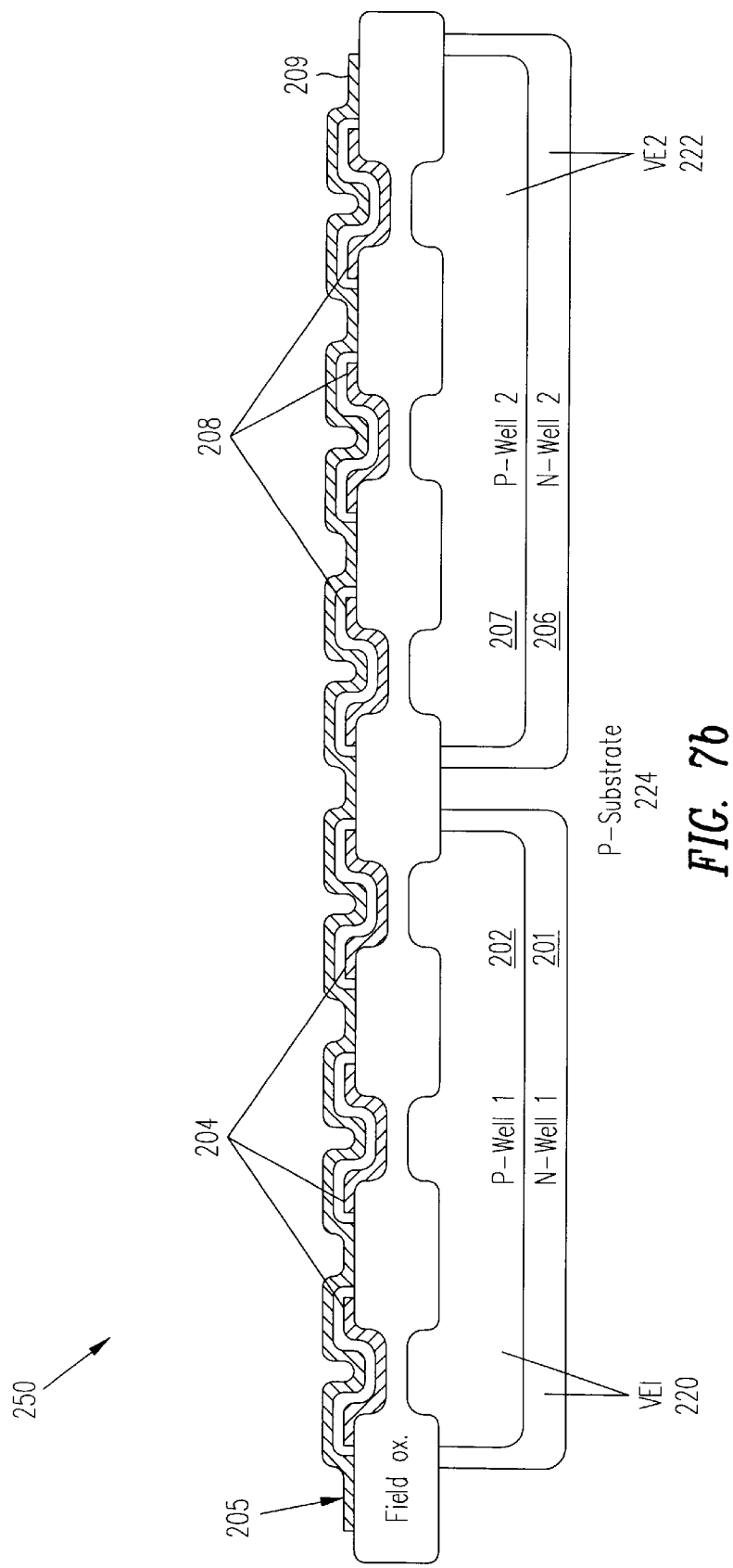
FIG. 7b illustrates shows a side view of the embodiment of FIG. 7.

In FIG. 7b, a cross section of the NAND cell structure 250, used in FIGS. 7 and 7a, is shown. In FIG. 7b, the control gate 205 is not connected to the control gate 209 and all of the flash cells in p-well 202 can be erased by raising the voltage on the p-well 202 (through the signal Ve1 220) while the p-well 207 remains at ground voltage (typically 0V) thereby avoiding erasure of the flash cells inside the p-well 207. The control gate 204 is caused to be connected to ground and the control gate 209 is floating. Similarly, all of the cells in the p-well 207 can be erased by raising the voltage on the p-well 207 (through the signal Ve2 222) while the p-well 202 remains at ground voltage thereby avoiding erasure of the flash cells inside the p-well 202. While not shown in FIG. 7b, the p-wells and n-wells extend across a number of cells. The control gates 204 and 209 are floating.

Referring to the embodiment of FIG. 3, the p-well 202 and the n-well 201 are included in the mainwell 44 to form the nonvolatile memory cells therein while the p-well 207 and the n-well 206 are included in the extension well 46 forming the cells therein thereby allowing separate erasure of the mainwell 44 and the extension well 46. Where user data is stored in the mainwell 44 of the array 32 (in FIG. 3) and extension information is stored in the extensionwell 42 of the array 32, separate erasure of user data and extension information is effectuated.

Figure 8:
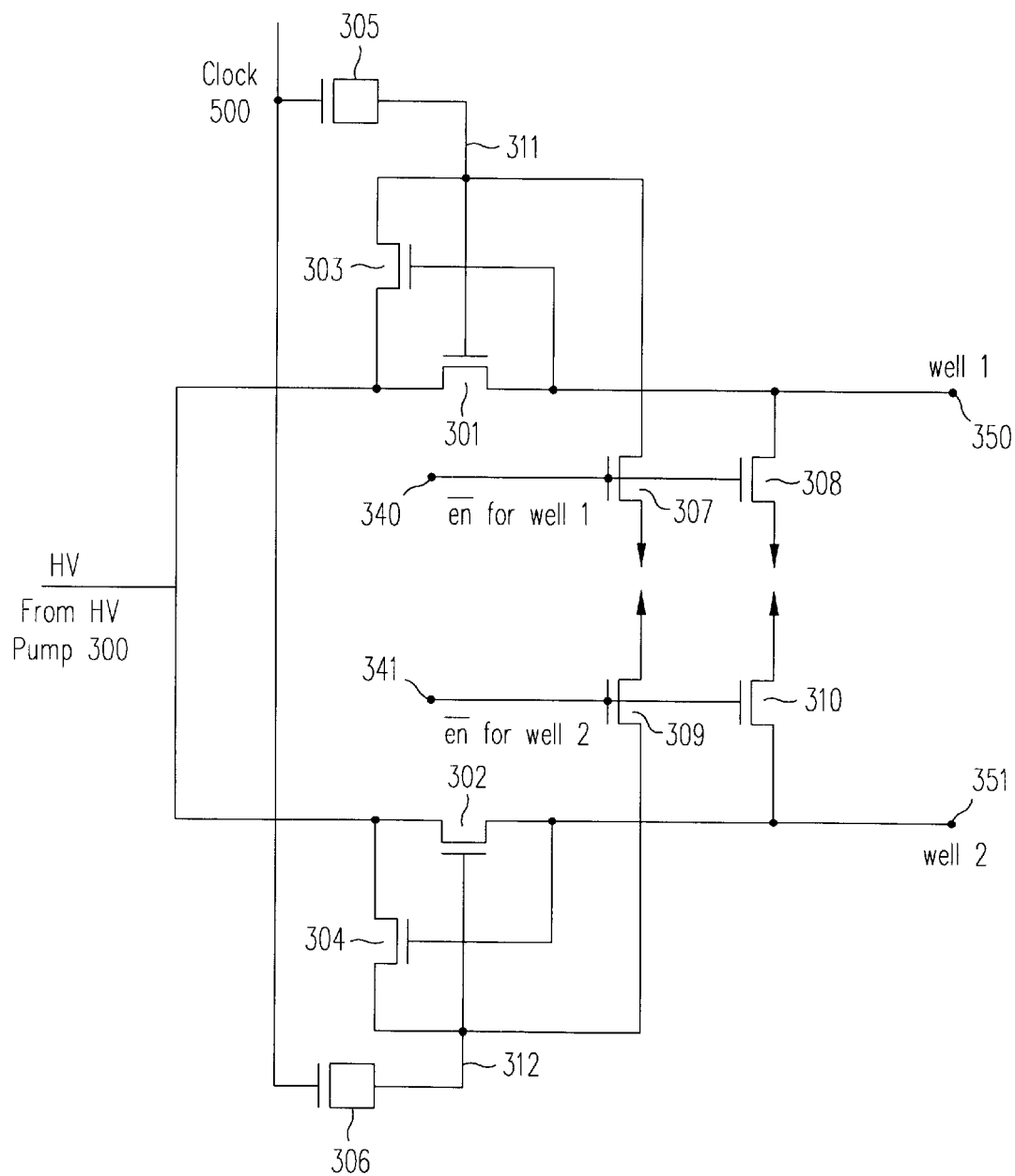
FIG. 8 shows a decoding circuit for use with the separately erasable cells of FIGS. 6 and 7.

In FIG. 8, a high voltage switching circuit is shown for two p-well erase configurations effectuating separate erasure of the main-well and extension-wells of the array 32 (in FIG. 3) and that is used to switch the high voltage, between different wells in the NAND cell structures 200 and 250, shown in FIGS. 6a and 7b, respectively. It should be noted that the signals 340 and 341 are controlled by a controller circuit and are each activated separately from the other to select which wells are to be erased thereby ultimately effecting erasure of the user data field separately from the extension field. That is, depending on which of these fields is to be erased, one of the signals 340 or 341 is activated at a given time and causes one of the signals 350 or 351 to raise the potential of a respective one of the signals 220 and 222 (shown in FIG. 6).

It should be noted that while references to and examples of NAND type cell structures used in nonvolatile memory units are provided herein, in alternative embodiments of the present invention, NOR type cell structures may be employed without departing from the scope and spirit of the present invention.

Although the present invention has been described in terms of specific embodiments it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method for operating a non-volatile memory array having a plurality of nonvolatile storage blocks for storing data, each block having one or more user data field and extension field, wherein each block is selectively programmable and erasable wherein blocks having superseded data may not be programmed until erased, the method comprising the steps of:

determining whether any blocks having superseded data remain;

periodically selecting blocks having superseded data for erasure thereof; and erasing the selected blocks wherein the user data fields of the selected blocks is erased separately from the extension fields of the selected blocks.

* * * * *